United States Patent
Cho et al.

(10) Patent No.: US 7,494,859 B2
(45) Date of Patent: Feb. 24, 2009

(54) SEMICONDUCTOR DEVICE HAVING METAL GATE PATTERNS AND RELATED METHOD OF MANUFACTURE

(75) Inventors: Hag-Ju Cho, Seoul (KR); Taek-Soo Jeon, Yongin-si (KR); Hye-Lan Lee, Hwaseong-si (KR); Sang-Bom Kang, Seoul (KR); Yu-Gyun Shin, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 52 days.

(21) Appl. No.: 11/400,243

(22) Filed: Apr. 10, 2006

(65) Prior Publication Data
US 2006/0226470 A1 Oct. 12, 2006

(30) Foreign Application Priority Data
Apr. 12, 2005 (KR) ............... 10-2005-0030179

(51) Int. Cl.
*H01L 21/8238* (2006.01)
(52) U.S. Cl. .............. 438/199; 438/592; 438/655; 438/656; 438/658; 257/E21.636; 257/E21.637
(58) Field of Classification Search .......... 438/275, 438/588, 592, 655, 666, 587, 657, 664, 199, 438/356, 658; 257/E21.621, E21.622, E21.623, 257/E21.624, E21.635, E21.636, E21.637
See application file for complete search history.

(56) References Cited

U.S. PATENT DOCUMENTS

| | | | |
|---|---|---|---|
| 5,907,791 A * | 5/1999 | Cappuzzo et al. ......... | 438/669 |
| 6,159,851 A * | 12/2000 | Chen et al. ................. | 438/669 |
| 6,518,106 B2 | 2/2003 | Ngai et al. | |
| 6,552,377 B1 | 4/2003 | Yu | |
| 6,770,521 B2 | 8/2004 | Visokay et al. | |
| 6,794,281 B2 | 9/2004 | Madhukar et al. | |
| 2004/0106249 A1 | 6/2004 | Huotari | |
| 2005/0258468 A1* | 11/2005 | Colombo et al. .......... | 257/314 |
| 2006/0118890 A1* | 6/2006 | Li ............................ | 257/410 |
| 2006/0124974 A1* | 6/2006 | Cabral et al. ............. | 257/274 |

OTHER PUBLICATIONS

Wolf et al., Silicon Processing for the VLSI Era, vol. 1: Process Technology, 1986 by Lattice Press, p. 194.*

* cited by examiner

*Primary Examiner*—Matthew Smith
*Assistant Examiner*—Julio J. Maldonado
(74) *Attorney, Agent, or Firm*—Volentine & Whitt, PLLC

(57) ABSTRACT

A semiconductor device comprising a semiconductor substrate having a first impurity region and a second impurity region, a first gate pattern formed on the first impurity region, and a second gate pattern formed on the second impurity region is disclosed. The first gate pattern comprises a first gate insulation layer pattern, a metal layer pattern having a first thickness, and a first polysilicon layer pattern. The second gate pattern comprises a second gate insulation layer pattern, a metal silicide layer pattern having a second thickness smaller than the first thickness, and a second polysilicon layer pattern. The metal silicide layer pattern is formed from a material substantially the same as the material from which the metal layer pattern is formed. A method for manufacturing the semiconductor device is also disclosed.

22 Claims, 7 Drawing Sheets

SEMICONDUCTOR DEVICE HAVING METAL GATE PATTERNS AND RELATED METHOD OF MANUFACTURE

BACKGROUND OF THE INVENTION

1. Field of the Invention

Example embodiments of the present invention relate to a semiconductor device and a method of manufacturing the semiconductor device. More particularly, example embodiments of the present invention relate to a semiconductor device comprising metal gate patterns and a related method of manufacture.

This application claims priority to Korean Patent Application No. 2005-0030179, filed on Apr. 12, 2005, the subject matter of which is hereby incorporated by reference in its entirety.

2. Description of the Related Art

In general, semiconductor devices comprise gate patterns, each of which comprises a gate insulation layer. Recent developments have produced a gate insulation layer formed from a material having a relatively high dielectric constant and having, therefore, a relatively small equivalent oxide thickness (EOT). This improvement significantly decreases leakage current between the gate pattern and an associated channel region.

However, when a polysilicon layer is formed directly on a gate insulation layer formed from a material having a relatively high dielectric constant, a fermi level pinning phenomenon may occur at an interface between the gate insulation layer and the polysilicon layer. This phenomenon essentially prevents charge carriers within the polysilicon layer from properly migrating. Thus, it may not be easy to control the flatband voltage (Vfb) of the constituent semiconductor device which is proportional to a threshold voltage.

On the other hand, forming a gate conductive layer by depositing a metal layer on the gate insulation layer yields many benefits. For example, the fermi level pinning phenomenon may be alleviated when a metal gate conductive layer is used. Additionally, an increased EOT—which is often generated by a poly depletion effect in a gate conductive layer formed from polysilicon—may also be avoided when the gate conductive layer is formed from metal. Further, charge trapping effects and remote charge scattering effects may be alleviated, thereby improving the operation speed of the constituent semiconductor device. Additionally, a metal gate conductive layer may also serve as a barrier layer preventing an undesired diffusion of impurities during implantation processes used to form source/drain regions of the semiconductor device.

Recently developed gate patterns comprise a gate insulation layer formed from a material having a high dielectric constant, and a gate conductive layer formed from metal and polysilicon. Methods of forming such a gate pattern are disclosed, for example, in U.S. Patent Application Publication No. 2004/0106249, U.S. Pat. No. 6,518,106, and U.S. Pat. No. 6,552,377.

U.S. Pat. No. 6,552,377 discloses a method of forming gate conductive layers for a PMOS region and an NMOS region, wherein the respective gate conductive layers comprise different metals. However, this method suffers from the disadvantage of forming the gate patterns through a relatively complicated process.

U.S. Pat. No. 6,518,106 discloses a method of forming gate conductive layers in an NMOS region and a PMOS region, wherein one of the gate conductive layers is formed from polysilicon and metal, and the other is formed from polysilicon. While this method forms gate conductive layers using a relatively simple process, the non-metal, gate conductive layer often suffers from one or more of the foregoing problems.

Clearly, the gate patterns for NMOS and PMOS regions should have different work functions to optimize performance of the respective active devices. In one attempt to provide gate patterns having satisfactory work functions, U.S. Patent Application Publication No. 2004/0106249 discloses a method of forming gate conductive layers, wherein the respective gate patterns for the NMOS and PMOS regions are formed from an identical metal layer, but with different thicknesses of the metal layer within the gate patterns. Therefore, according to this method, the gate conductive layer is formed by a relatively simple process, the respective gate patterns for the NMOS and PMOS regions have the advantage of being formed from both metal and polysilicon, and the respective gate patterns for the NMOS and PMOS regions have different work functions—as defined by the different thicknesses of the conductive layers within the respective gate patterns.

However, in the method disclosed in U.S. Patent Application Publication No. 2004/0106249, the work functions of the gate patterns are directly dependent upon only the thickness of the gate patterns. Unfortunately, this approach to gate pattern formation is limited in the range of work functions achievable in the respective NMOS and PMOS regions. Further, the exact work functions for the NMOS and PMOS regions may not be finely adjusted to a degree required for contemporary semiconductor device designs.

SUMMARY OF THE INVENTION

In one example embodiment, the present invention provides a semiconductor device comprising a semiconductor substrate having a first impurity region and a second impurity region, a first gate pattern formed on the first impurity region, and a second gate pattern formed on the second impurity region. The first gate pattern comprises a first gate insulation layer pattern, a metal layer pattern having a first thickness, and a first polysilicon layer pattern. The second gate pattern comprises a second gate insulation layer pattern, a metal silicide layer pattern having a second thickness smaller than the first thickness, and a second polysilicon layer pattern. In addition, the metal silicide layer pattern is formed from a material substantially the same as the material from which the metal layer pattern is formed.

In another example embodiment, the present invention provides a method of manufacturing a semiconductor device comprising forming a gate insulation layer on a semiconductor substrate having a first impurity region and a second impurity region, forming a metal layer having a first thickness on the gate insulation layer, forming a preliminary pattern having a second thickness substantially smaller than the first thickness, forming a polysilicon layer on a resultant structure comprising the preliminary pattern, transforming the preliminary pattern into a metal silicide layer through a reaction between the preliminary pattern and the polysilicon layer, and etching the polysilicon layer, the metal silicide layer, the metal layer, and the gate insulation layer to form a first gate pattern on the first impurity region and a second gate pattern on the second impurity region. The first gate pattern comprises a first gate insulation layer pattern, a metal layer pattern, and a first polysilicon layer pattern. The second gate pattern comprises a second gate insulation layer pattern, a metal silicide layer pattern, and a second polysilicon layer pattern.

In yet another example embodiment, the present invention provides a method of manufacturing a semiconductor device comprising forming a gate insulation layer on a semiconductor substrate having a first impurity region and a second impurity region; forming a lower metal layer having a first thickness on the gate insulation layer, wherein a first portion of the lower metal layer is disposed over the first impurity region and a second portion of the lower metal layer is disposed over the second impurity region; and forming a lower polysilicon layer on the second portion of the lower metal layer. The method further comprises transforming the second portion of the lower metal layer into a metal silicide layer through a reaction between the lower metal layer and the lower polysilicon layer; forming an upper metal layer having a second thickness, wherein the upper metal layer is formed continuously on the lower polysilicon layer and the first portion of the lower metal layer; forming an upper polysilicon layer on the upper metal layer; and, patterning the upper polysilicon layer, the upper metal layer, the lower polysilicon layer, the metal silicide layer, the first portion of the lower metal layer, and the gate insulation layer to form a first gate pattern on the first impurity region and a second gate pattern on the second impurity region. The first gate pattern comprises a first gate insulation layer pattern, a lower metal layer pattern, a first upper metal layer pattern, and a first polysilicon layer pattern. The second gate pattern comprises a second gate insulation layer pattern, a metal silicide pattern, a second polysilicon layer pattern, a second upper metal layer pattern, and a third polysilicon layer pattern.

BRIEF DESCRIPTION OF THE DRAWINGS

Example embodiments of the present invention will be described with reference to the accompanying drawings, in which like reference numerals refer to like or similar elements throughout. In the drawings.

DESCRIPTION OF THE EXEMPLARY EMBODIMENTS

Figure 1:
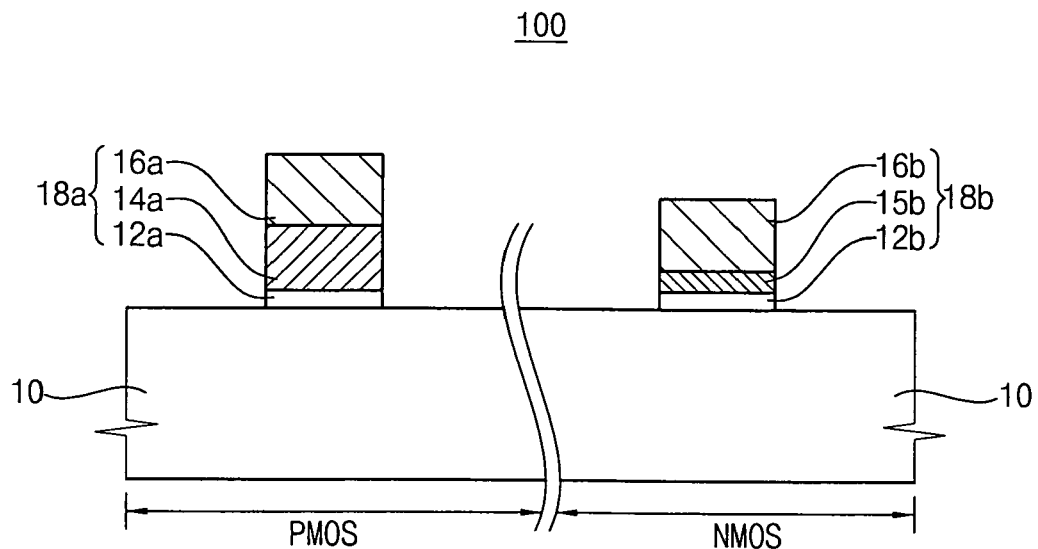
FIG. 1 is a cross-sectional view illustrating a semiconductor device in accordance with an example embodiment of the present invention.

In the drawings, the sizes and relative sizes of layers and regions may be exaggerated for clarity.

It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. Similarly, the term "over" may be used to describe one element or layer being disposed above another element or layer with or without intervening layers and elements. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections are not limited by these terms. These terms are only used to distinguish one element, component, region, layer, or section from another. Thus, a first element, component, region, layer, or section discussed below could be referred to as a second element, component, region, layer, or section without departing from the scope of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees, or at other orientations) and the spatially relative descriptors used herein interpreted accordingly.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes, regions, layers and elements are not intended to illustrate the actual shape of a region of a device and are not intended to limit the scope of the present invention.

FIG. 1 is a cross-sectional view illustrating a semiconductor device in accordance with an example embodiment of the present invention.

Referring to FIG. 1, a semiconductor device 100 includes a semiconductor substrate 10 having a first impurity region and a second impurity region, a first gate pattern 18a formed on the first impurity region, and a second gate pattern 18b formed on the second impurity region. In the illustrated embodiment, the first impurity region is a PMOS region while the second impurity region is an NMOS region.

The first gate pattern 18a includes a first gate insulation layer pattern 12a, a metal layer pattern 14a having a first thickness, and a first polysilicon layer pattern 16a.

The second gate pattern 18b includes a second gate insulation layer pattern 12b, a metal silicide layer pattern 15b having a second thickness, and a second polysilicon layer pattern 16b.

FIGS. 2A through 2E are cross-sectional views illustrating a method of manufacturing a semiconductor device in accordance with an example embodiment of the present invention.

Figure 2A:
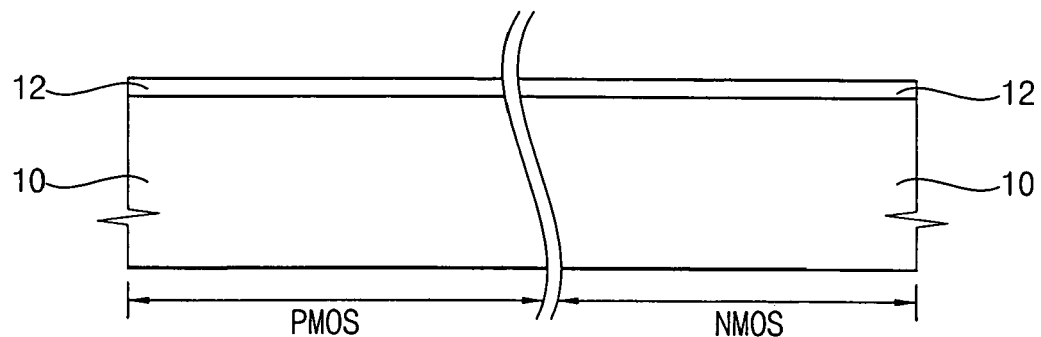
FIGS. 2A to 2E are cross-sectional views illustrating a method of manufacturing a semiconductor device in accordance with an example embodiment of the present invention.

Referring to FIG. 2A, a semiconductor substrate 10 may includes, for example, a silicon substrate or a silicon-on-insulator (SOI) substrate.

P-type impurities are doped into a first area of the semiconductor substrate 10 and N-type impurities are doped into a second area of the semiconductor substrate 10. Thus, a first impurity region and a second impurity region are formed in respective upper portions of the semiconductor substrate 10. In the illustrated embodiment, the first impurity region is a PMOS region and the second impurity region is an NMOS region.

An isolation layer (not shown) may be formed at an upper portion of the semiconductor substrate 10 to define active regions and field regions within the semiconductor substrate 10.

A gate insulation layer 12 is formed on the semiconductor substrate 10. The gate insulation layer 12 may be formed from a material such as hafnium oxide, hafnium oxynitride, hafnium silicon oxynitride, zirconium oxide, zirconium oxynitride, zirconium silicon oxynitride, tantalum oxide, tantalum oxynitride, tantalum silicon oxynitride, aluminum oxide, aluminum oxynitride, aluminum silicon oxynitride, titanium oxide, titanium oxynitride, titanium silicon oxynitride, etc. Such materials may be used alone or in a combination.

The gate insulation layer 12 may be formed by a chemical vapor deposition (CVD) process or an atomic layer deposition (ALD) process. In an example embodiment of the present invention, the gate insulation layer 12 includes hafnium silicon oxynitride and has an EOT of about 20 Å. The gate insulation layer 12 including hafnium silicon oxynitride may be formed through the ALD process.

Hereinafter, an example process for forming the gate insulation layer 12 including hafnium silicon oxynitride, in accordance with an example embodiment of the present invention, will be described as one example of the invention.

After the semiconductor substrate 10 is loaded into a conventional process chamber, the chamber is heated to a temperature of about 300° C. at a pressure of about 1.0 Torr. A hafnium precursor, such as tetrakis diethyl amino hafnium (TDEAH) or hafnium (IV) tert-butoxide ($Hf(OtBu)_4$), is then introduced into the chamber. The hafnium precursor is provided for about one second. A first portion of the hafnium precursor is chemisorbed (i.e., chemically absorbed) by the surface of the semiconductor substrate 10. A second portion of the hafnium precursor is physisorbed (i.e., physically absorbed) by the surface of the semiconductor substrate 10 and/or the chemisorbed first portion of the hafnium precursor.

A first purge gas, such as an argon (Ar) gas, is then introduced into the chamber for about one second to remove the physisorbed second portion of the hafnium precursor from the chamber.

Next, a first oxidizing agent, such as oxygen ($O_2$) or ozone ($O_3$), is introduced in the chamber for about three seconds. The chemisorbed first portion of the hafnium precursor will react with the first oxidizing agent to thereby form hafnium oxide (e.g., a first solid material layer) on the semiconductor substrate 10.

A second purge gas is then introduced onto the chamber for about three seconds to remove the un-reacted portion of first oxidizing agent (i.e., the remaining first oxidizing agent) from the chamber.

A silicon source material, such as tetrakis diethyl amino silicon (TDMAS) or tetra methoxy silane (TMOS), is then provided for about ten seconds in the chamber. In the example process, a first portion of the silicon source material is chemisorbed by the first solid material on the semiconductor substrate 10, whereas a second portion of the silicon source material is physisorbed by the first solid material on the semiconductor substrate 10 and/or the chemisorbed first portion of the silicon source material.

A third purge gas is then introduced into the chamber for about one second to remove the physisorbed second portion of the silicon source material from the chamber.

Then, a second oxidizing agent is provided for about three seconds. The chemisorbed first portion of the silicon source material will react with the second oxidizing agent to thereby form a second solid material (e.g., silicon oxide) on the first solid material formed on the semiconductor substrate 10.

A fourth purge gas is then introduced into the chamber for about three seconds to thereby remove the un-reacted portion of the second oxidizing agent (i.e., the remaining second oxidizing agent) from the chamber.

The steps for forming the first and the second solid materials described above may be performed repeatedly, if necessary. In this manner, a hafnium silicon oxide film having a desired thickness may be formed on the semiconductor substrate 10. In one embodiment of the present invention, the hafnium silicon oxide film is formed with an equivalent oxide thickness (EOT) of about 20 Å by adjusting the number of process repetitions used to form the first and the second solid materials.

The hafnium silicon oxide film may then be nitrified through a nitridation treatment to thereby form a hafnium silicon oxynitride film on the semiconductor substrate 10. When the gate insulation layer 12 is formed from the hafnium silicon oxynitride film, the gate insulation layer 12 may include hafnium silicon oxynitride formed through the process described above. The gate insulation layer 12 including hafnium silicon oxynitride may reduce the occurrence of process failures such as the penetration of impurities into the region under a gate pattern during a process for forming source/drain regions wherein the process comprises doping impurities.

Figure 2B:
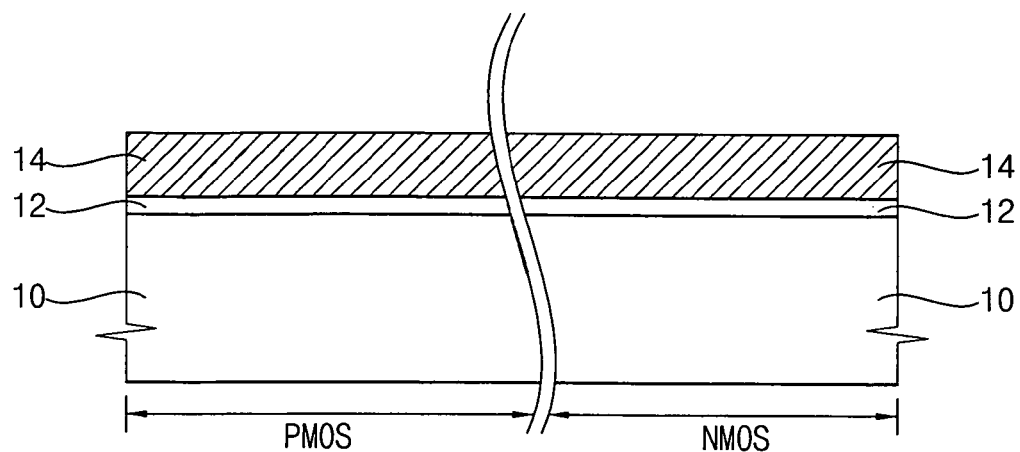

Referring to FIG. 2B, a metal layer 14 having a first thickness is formed on the gate insulation layer 12. the metal layer 14 may be formed using a metal or a metal nitride. For example, the metal layer 14 may be formed from nickel, tungsten, platinum, titanium, tantalum, zirconium, copper, ruthenium, hafnium, aluminum or any combination thereof. Alternatively, the metal layer 14 may be formed from titanium nitride, titanium aluminum nitride, hafnium nitride, hafnium aluminum nitride, tantalum nitride, tantalum aluminum nitride, zirconium aluminum nitride, aluminum nitride or any combination thereof.

The metal layer 14 may be formed on the gate insulation layer 12 through a chemical vapor deposition (CVD) process, an atomic layer deposition (ALD) process, or a sputtering process. In one embodiment, the metal layer 14 is formed to a thickness t1 (see FIG. 2C) of about 50 to 200 Å measured from an upper face of the gate insulation layer 12 to an upper face of the metal layer 14. In one embodiment, the metal layer 14 is formed from tantalum nitride using a CVD process. However, a sputtering process may be also used to form the metal layer 14 from tantalum nitride.

Hereinafter, an example process for forming the metal layer 14 from tantalum nitride using the sputtering process will be described.

The semiconductor substrate 10, on which the gate insulation layer 12 has been formed and a tantalum target are loaded into a conventional process chamber to begin the sputtering process. Argon atoms, accelerated in a plasma state, collide with tantalum atoms in the tantalum target, thereby separating the tantalum atoms from the tantalum target. While generating the tantalum atoms from the tantalum target, a nitrogen ($N_2$) gas is introduced into the chamber. Thus, the tantalum atoms react with nitrogen atoms so that tantalum nitride is deposited on the gate insulation layer 12 disposed on semiconductor substrate 10. As a result, the metal layer 14 of desired thickness may be formed from tantalum nitride on the gate insulation layer 12 by repeating the process described above as needed.

In one embodiment of the present invention, the metal layer 14 is thermally treated. The metal layer 14 may be thermally treated at a temperature ranging from about 450 to 650° C. for about 10 to 60 seconds. For example, in one specific example, a thermal treatment of the metal layer 14 may be performed in a nitrogen atmosphere at a temperature of about 550° C. for about 30 seconds. In another example, the metal layer 14 may be thermally treated using a plasma formed in the process chamber.

Figure 2C:
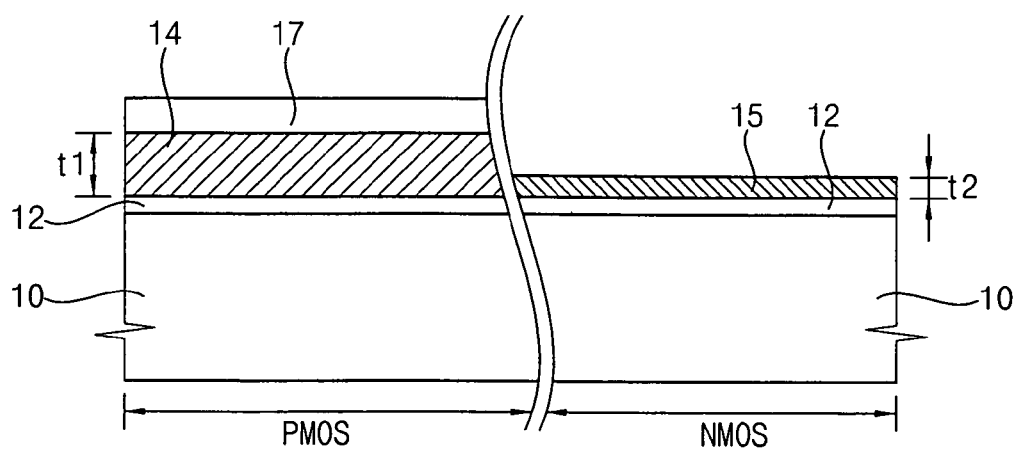

Referring to FIG. 2C, an etching mask 17 is formed on a first portion of the metal layer 14, which is disposed over the first impurity region. Hence, a second portion of the metal layer 14, which is disposed over the second impurity region, is exposed. The etching mask 17 may include a photoresist or an oxide, for example.

Hereinafter, an example process for forming the etching mask 17 will be described in relation to one embodiment of the present invention.

The process generally comprises forming an oxide film on the metal later 14. After the oxide film is formed on the metal layer 14, a photoresist film is formed on the oxide film. A second portion of the photoresist layer, which is disposed over the second impurity region, is removed through an exposure step and a developing step to thereby form a photoresist pattern over the first impurity region. A second portion of the oxide film, which is exposed by the photoresist pattern, is etched, and the photoresist pattern is then removed. As a result, the etching mask 17, which is formed from oxide, is formed on the first portion of the metal layer 14. The first portion of the metal layer 14 is disposed over the first impurity region of the semiconductor substrate 10.

The second portion of the metal layer 14 is then partially removed using the etching mask 17 to form a preliminary pattern 15 over the second impurity region. The preliminary pattern 15 has a second thickness t2. In this example process, the ratio between the first thickness t1 and the second thickness t2 is in a range from about 10:1 to about 2:1. For example, when the first thickness t1 of the first portion of the metal layer 14 is in a range of from about 50 to 200 Å, the second thickness t2 of the preliminary pattern 15 is in a range of from about 5 to 50 Å.

In one embodiment of the present invention, the preliminary pattern 15 has a thickness of about 30 Å when the first portion of the metal layer 14 has a thickness of about 100 Å. That is, the second portion of the metal layer 14 is partially removed to a depth of about 70 Å so that the preliminary pattern 15 has a thickness of about 30 Å. The second portion of the metal layer 14 may be partially removed using an etching solution including a standard cleaning 1 (SC-1) solution and an ethylene diamine tetraacetic acid (EDTA) solution. The conventionally known SC-1 solution includes ammonia, hydrogen peroxide, and deionized water.

In one embodiment of the present invention, the second portion of the metal layer 14 is treated using a nitrogen plasma after forming the etching mask 17 on the first portion of the metal layer 14. Particularly, the nitrogen plasma treatment is performed in such a way that the nitrogen plasma penetrates the second portion of the metal layer 14 to the depth to which the second portion of the metal layer 14 will subsequently be removed during the formation of the preliminary pattern 15. When the second portion of the metal layer 14 will be removed to a depth of about 70 Å, the nitrogen plasma penetrates into the second portion of the metal layer 14 to a depth of about 70 Å. In this example embodiment, the nitrogen plasma treatment is performed under a pressure of about 5 to 50 mTorr for about 60 to 120 seconds while applying a power of about 1,000 to 2,000 W. For example, the nitrogen plasma treatment may be performed under a pressure of about 10 mTorr for about 90 seconds.

When the second portion of the metal layer 14 is treated with the nitrogen plasma treatment described above, the second portion of the metal layer 14 may be partially removed at a relatively low temperature. That is, after the nitrogen plasma treatment, the second portion of the metal layer 14 may be easily removed using the etching solution, wherein the etching solution has a temperature of about 20 to 80° C. On the contrary, when the nitrogen plasma treatment is not performed on the second portion of the metal layer 14, the second portion of the metal layer 14 may be removed using the etching solution, wherein the etching solution has a temperature of greater than about 150° C. Accordingly, since the second portion of the metal layer 14 may be removed at the relatively low temperature after the nitrogen plasma treatment, the manufacturing process for a semiconductor device 100 (of FIG. 1) may be performed stably and without causing thermal stress.

The etching mask 17 is removed at the end of this process.

Figure 2D:
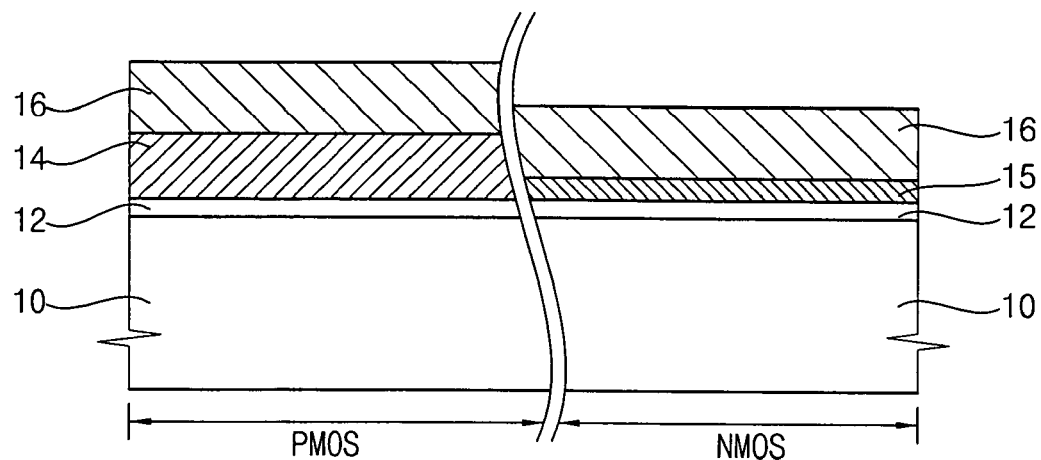
Figure 2E:
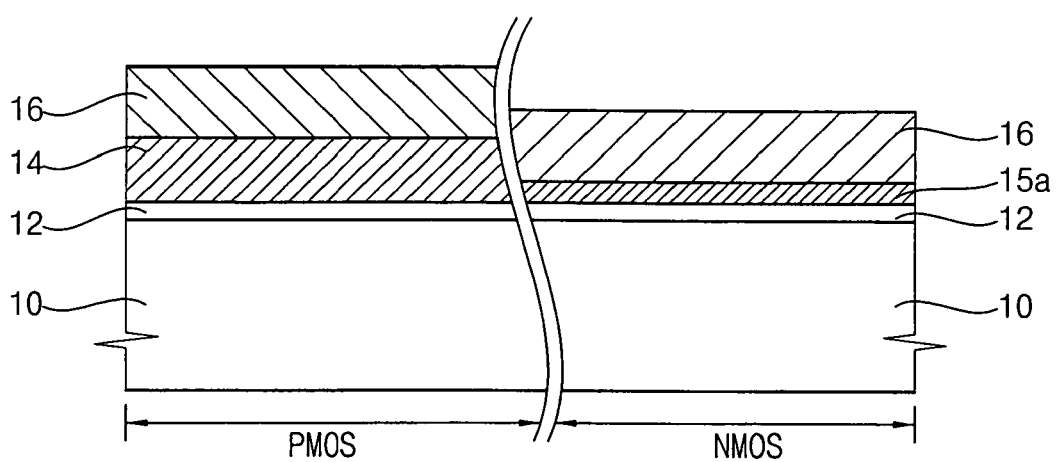

Referring to FIGS. 2D and 2E, a polysilicon layer 16 is formed on a first resultant structure including the preliminary pattern 15 and the first portion of the metal layer 14. As used herein, "resultant structure" refers to an intermediate structure formed on a semiconductor substrate during the formation of first and second gate patterns. Hereinafter, with reference to FIGS. 2D and 2E, the first portion of the metal layer 14 will be referred to as the metal layer 14.

The polysilicon layer 16 may be formed through a CVD process or a thermal decomposition process. Because the preliminary pattern 15 is relatively thin, when the polysilicon layer 16 is formed at a temperature of about 700 to 1,200° C., metal in the preliminary pattern 15 may react with silicon contained in the polysilicon layer 16 in such a way that the preliminary pattern 15 is converted into a metal silicide layer 15a. Since the metal layer 14 is relatively thick, however, only a surface of the metal layer 14 may react with polysilicon layer 16 during the formation of the polysilicon layer 16 at the temperature of about 700 to 1,200° C.

However, when the polysilicon layer 16 is formed by thermally decomposing a silane gas at a temperature of about 500 to 650° C., the preliminary pattern 15 may not be converted into the metal silicide layer 15a. Therefore, when the polysilicon layer 16 is formed at temperature of about 500 to 650° C., the polysilicon layer 16 may subsequently be thermally treated at a temperature of about 700 to 1,200° C. to convert the preliminary pattern 15 into the metal silicide layer 15a.

Hereinafter, an example process for forming the polysilicon layer 16 and the metal silicide layer 15a in accordance with an example embodiment of the present invention will be described.

A pure silane gas or a silane gas diluted with about 20 to 30 percent by weight of nitrogen is thermally decomposed in a chamber containing the semiconductor substrate 10 on which the metal layer 14 and the preliminary pattern 15 have been formed. The chamber may be heated, for example, to a temperature of about 500 to 650° C. at a pressure of about 25 to 150 Pa. The polysilicon layer 16 is formed on the metal layer 14 and the preliminary pattern 15 through the thermal decomposition process. In one embodiment of the present invention, impurities may be doped into the polysilicon layer 16 while forming the polysilicon layer 16. For example, phosphor may be doped into a first portion of the polysilicon layer 16 positioned over the first impurity region and boron may be doped into a second portion of the polysilicon layer 16 formed over the second impurity region.

Next, the polysilicon layer 16 is thermally treated so that metal in the preliminary pattern 15 may react with silicon in the polysilicon layer 16. Thus, the preliminary pattern 15 is converted into the metal silicide layer 15a in accordance with a silicidation reaction between metal and silicon. When the polysilicon layer 16 is thermally treated at a temperature below about 700° C., metal in the preliminary pattern 15 may not react strongly with the polysilicon layer 16. However, when the polysilicon layer 16 is thermally treated at a temperature of greater than about 1,200° C., a second resultant structure (including the first resultant structure and the polysilicon layer 16) and/or the semiconductor substrate 10 may suffer thermal damage. Therefore, in one embodiment of the present invention, the polysilicon layer 16 is thermally treated at a temperature of about 700 to 1,200° C. for about 10 to 300 seconds. In one specific example, the polysilicon layer 16 was thermally treated at a temperature of about 1,000° C. for about ten seconds. As a result, the preliminary pattern 15 disposed over the second impurity region is converted into the metal silicide layer 15a.

The second resultant structure, which includes the polysilicon layer 16, the metal silicide pattern 15a, the metal layer 14, and the gate insulation layer 12, is partially etched to form a first gate pattern 18a and a second gate pattern 18b on the semiconductor substrate 10. As shown in FIG. 1, the first gate pattern 18a, which is formed on the first impurity region, includes a first gate insulation layer pattern 12a, a metal layer pattern 14a having the first thickness, and a first polysilicon layer pattern 16a. The second gate pattern 18b, which is formed on the second impurity region, includes a second gate insulation layer pattern 12b, a metal silicide layer pattern 15b having the second thickness, and a second polysilicon layer pattern 16b.

In accordance with an example embodiment of the present invention, the first and the second gate patterns 18a and 18b may be formed on the semiconductor substrate 10 through relatively simple processes. Since the first and the second gate patterns 18a and 18b each includes metal, the first and the second gate patterns 18a and 18b may have improved electrical characteristics relative to conventional gate patterns that do not include metal. Further, the first and the second gate patterns 18a and 18b may have proper electrical characteristics as occasion demands because the first gate pattern 18a, which mainly includes metal (i.e., not metal silicide), has a work function substantially different from that of the second gate pattern 18b, which mainly comprises metal silicide. Particularly, the work functions of the first and the second gate patterns 18a and 18b may be precisely adjusted because the metal silicide layer pattern 15b of the second gate pattern 18b may have a work function substantially similar to that of the polysilicon layer pattern 16b of the second gate pattern 18b.

Figure 3:
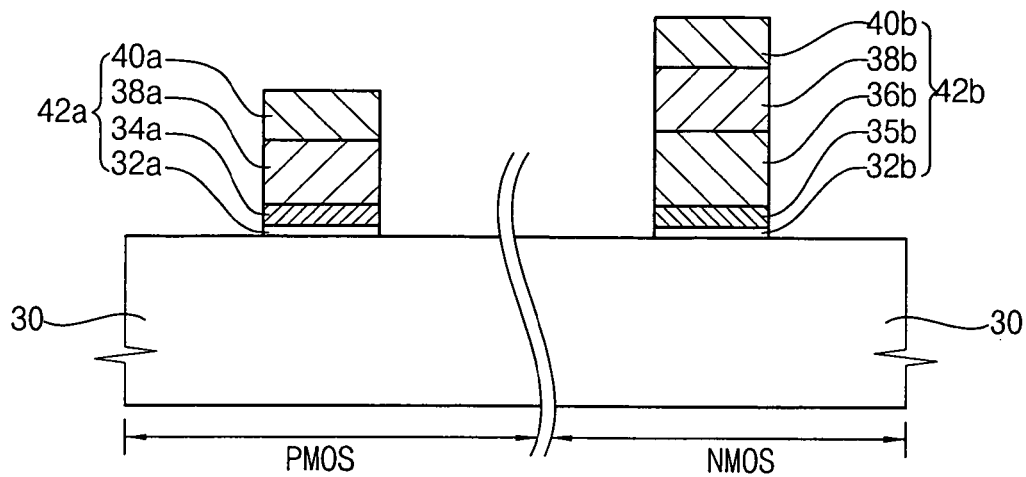
FIG. 3 is a cross-sectional view illustrating a semiconductor device in accordance with an example embodiment of the present invention.

FIG. 3 is a cross-sectional view illustrating a semiconductor device in accordance with an example embodiment of the present invention.

Referring to FIG. 3, a semiconductor device 200 includes a semiconductor substrate 30 having a first impurity region, such as a PMOS region, a second impurity region, such as an NMOS region, a first gate pattern 42a formed on the first impurity region, and a second gate pattern 42b formed on the second impurity region.

The first gate pattern 42a includes a first gate insulation layer pattern 32a, a lower metal layer pattern 34a, a first upper metal layer pattern 38a, and a first polysilicon layer pattern 40a. In addition, the lower metal layer pattern 34a and the first upper metal layer pattern 38a form a metal layer pattern. The second gate pattern 42b includes a second gate insulation layer pattern 32b, a metal silicide layer pattern 35b, a second polysilicon layer pattern 36b, a second upper metal layer pattern 38b, and a third polysilicon layer pattern 40b.

FIGS. 4A through 4E are cross-sectional views illustrating a method for manufacturing the semiconductor device illustrated in FIG. 3 in accordance with an example embodiment of the present invention.

Figure 4A:
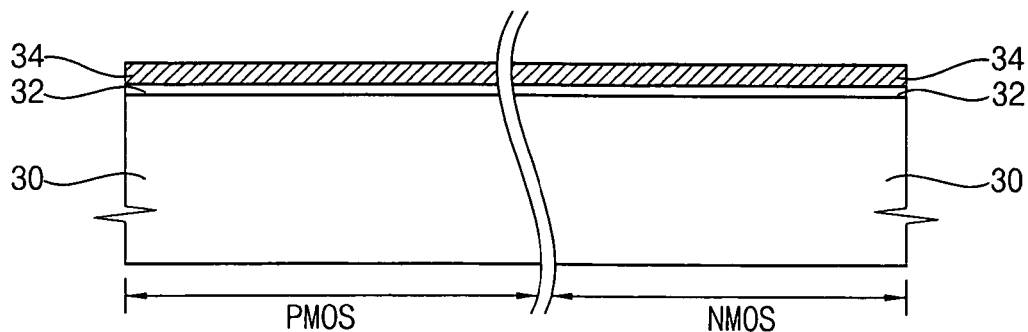
FIGS. 4A to 4E are cross-sectional views illustrating a method for manufacturing a semiconductor device in accordance with an example embodiment of the present invention.

Referring to FIG. 4A, a semiconductor substrate 30 includes a first impurity region and a second impurity region. In the illustrated method, the first impurity region and the second impurity region are a PMOS region and an NMOS region, respectively. The semiconductor substrate 30 may include active regions and field regions that are substantially the same as those described with reference to the semiconductor substrate 10 of FIG. 2A.

A gate insulation layer 32 is formed on the semiconductor substrate 30. The gate insulation layer 32 may be formed through a process substantially the same as the process by which the gate insulation layer 12 (of FIG. 2A, etc.) is formed, as described previously.

A lower metal layer 34 is formed on the gate insulation layer 32. The lower metal layer 34 may be formed by a process substantially the same as the process by which the metal layer 14 (of FIG. 2B) is formed, as described previously, except for the thickness of the lower metal layer 34.

In the illustrated method, the lower metal layer 34 has a thickness of about 5 to 50 Å measured from an upper face of the gate insulation layer 32 to an upper face of the lower metal layer 34. For example, the lower metal layer 34 may have a thickness of about 30 Å.

Figure 4B:
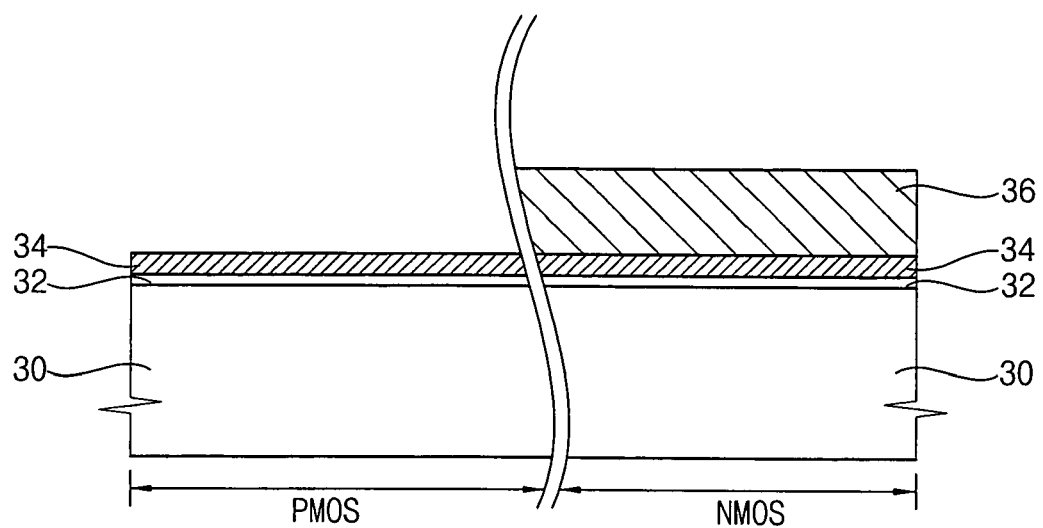
Figure 4C:
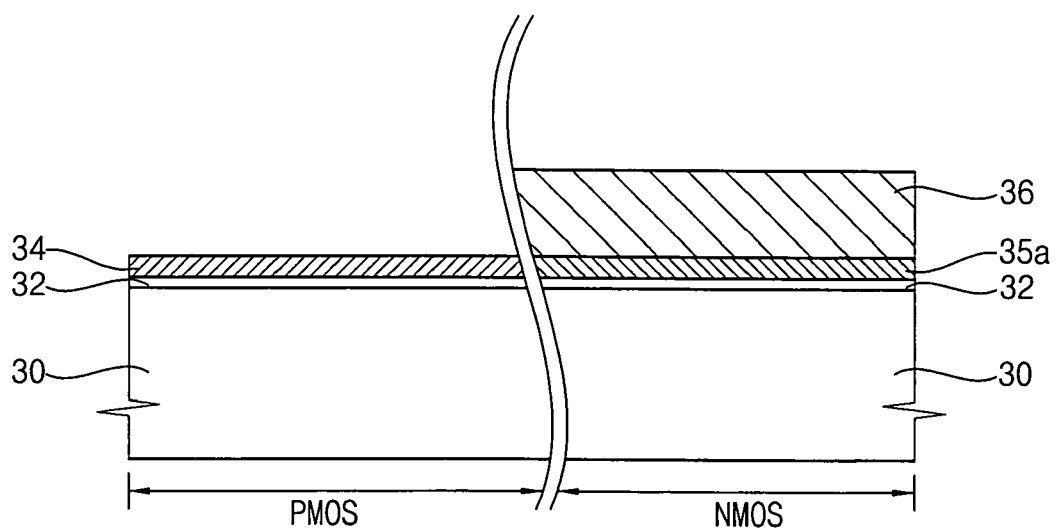

Referring to FIGS. 4B and 4C, a lower polysilicon layer 36 is formed on a second portion of the lower metal layer 34 disposed over the second impurity region. Hereinafter, a process for forming the lower polysilicon layer 36 will be described in detail.

A preliminary polysilicon layer (not shown) is formed on the lower metal layer 34 through a process substantially the same as the process for forming the polysilicon layer 16 (of FIG. 2D), as described previously. Next, a photoresist film is formed on the preliminary polysilicon layer, and the photoresist film is then exposed and developed to thereby form a photoresist pattern on a second portion of the preliminary polysilicon layer disposed over the second impurity region. A first portion of the preliminary polysilicon layer, which is disposed over the first impurity region and exposed by the photoresist pattern, is etched using the photoresist pattern as an etching mask. Hence, the lower polysilicon layer 36 is formed on the second portion of the lower metal layer 34 disposed over the second impurity region After the lower polysilicon layer 36 is formed, a thermal treatment process is performed as described previously with regard to the polysilicon layer 16 (of FIG. 2D). Hence, the lower polysilicon layer 36 reacts with the lower metal layer 34 and the lower metal layer 34 is thereby converted into a metal silicide layer 35a.

Figure 4D:
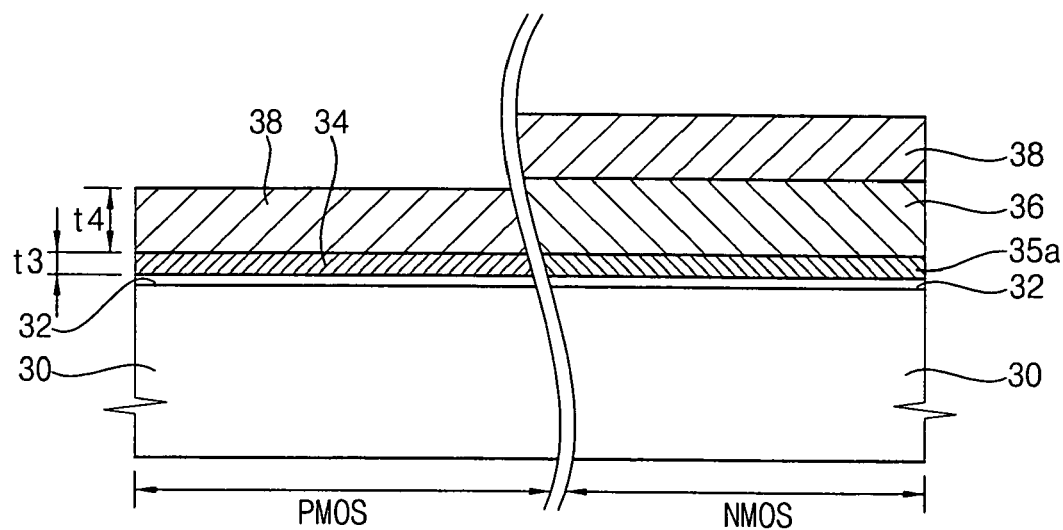

Referring to FIG. 4D, an upper metal layer 38 is formed continuously (i.e., as one layer) on the lower polysilicon layer 36 and the first portion of the lower metal layer 34. That is, the upper metal layer 38 covers the first and the second impurity regions. The lower metal layer 38 may be formed by a process substantially the same as the process for forming the metal layer 14 described with reference to FIG. 2B, except for a thickness of the upper metal layer 38.

In the illustrated method, the upper metal layer 38 has a thickness of about 50 to 200 Å. For example, the upper metal layer 38 may have a thickness of about 100 Å. The ratio between a thickness t4 of the upper metal layer 38 and a thickness t3 of the lower metal layer 34 may be in a range of about 10:1 to about 2:1.

Figure 4E:
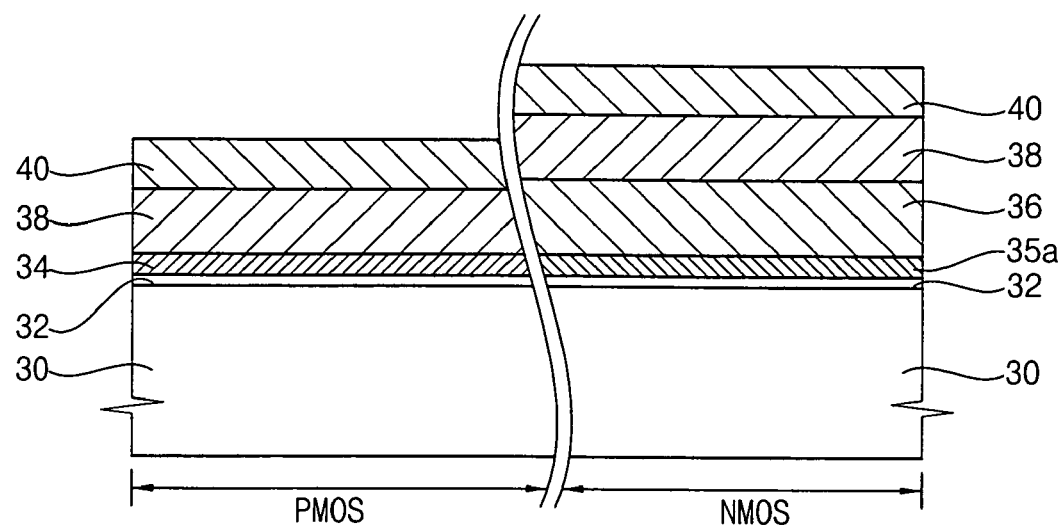

Referring to FIG. 4E, an upper polysilicon layer 40 is formed on the upper metal layer 38. The upper polysilicon layer 40 may be formed by a process substantially the same as the process for forming the polysilicon layer 16 described with reference to FIG. 2D.

A third resultant structure including the metal silicide layer 35a is etched to thereby form a first gate pattern 42a on the first impurity region of the semiconductor substrate 30 and a second gate pattern 42b on the second impurity region of the semiconductor substrate 30. As shown in FIG. 3, the first gate pattern 42a includes a first gate insulation layer pattern 32a, a lower metal layer pattern 34a, a first upper metal layer pattern 38a, and a first polysilicon layer pattern 40a. The second gate pattern 42b includes a second gate insulation layer pattern 32b, a metal silicide layer pattern 35b, a second polysilicon layer pattern 36b, a second upper metal layer pattern 38b, and a third polysilicon layer pattern 40b.

In accordance with an example embodiment of the present invention described above, the first and the second gate patterns 42a and 42b, each including metal, may be formed on the semiconductor substrate 30 through relatively simple processes. Also, the first and the second gate patterns 42a and 42b may have enhanced electrical characteristics relative to gate patterns that do not include metal. Additionally, work functions of the first and the second gate patterns 42a and 42b may be precisely adjusted.

In another example embodiment of the present invention, after the lower metal layer 34 disposed over the first impurity region is partially converted into the metal silicide layer 35a by thermally treating a fourth resultant structure illustrated in FIG. 4C, the lower polysilicon layer 36 may be removed. When the upper metal layer 38 is formed after removing the lower polysilicon layer 36, the step (e.g., the height difference) between the first and the second gate patterns 42a and 42b may be greatly reduced.

Figure 5:
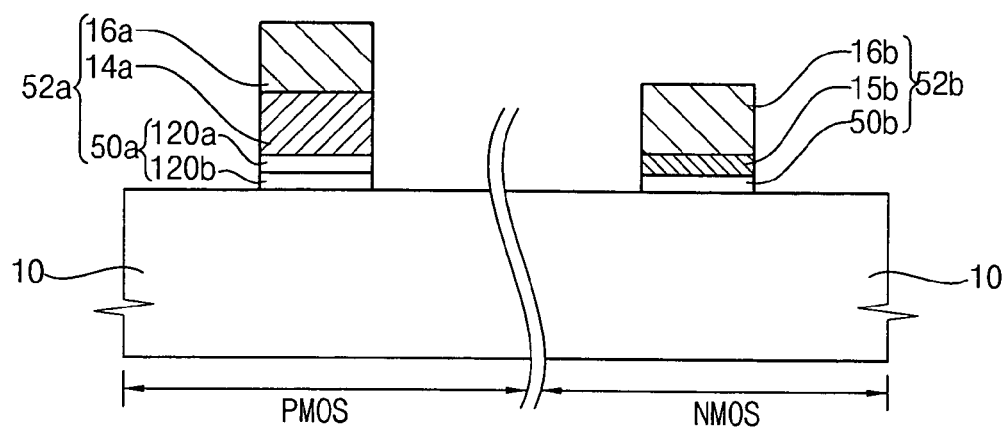
FIG. 5 is a cross-sectional view illustrating a semiconductor device in accordance with an example embodiment of the present invention; and, FIG. 6 shows graphs illustrating binding energies of materials that gate patterns of a semiconductor device in accordance with an example embodiment of the present invention.

FIG. 5 is a cross-sectional view illustrating a semiconductor device in accordance with an example embodiment of the present invention.

Referring to FIG. 5, a semiconductor device 300 includes a first gate pattern 52a and a second gate pattern 52b formed on a semiconductor substrate 10. The first and the second gate patterns 52a and 52b have substantially the same structure as the first and the second gate patterns 18a and 18b of FIG. 1, respectively, except for a first gate insulation layer pattern 50a of first gate pattern 52a formed on a first impurity region of the semiconductor substrate 10. The first gate pattern 52a includes a first gate insulation layer pattern 50a that has dual thin film patterns 120a and 120b (i.e., a first thin film pattern 120a and a second thin film pattern 120b). However, the second gate pattern 52b formed on a second impurity region includes a second gate insulation layer pattern 50b that has a single thin film pattern. For example, the first gate insulation layer pattern 50a includes hafnium silicon oxynitride and aluminum oxide, whereas the second gate insulation layer pattern 50b includes hafnium silicon oxynitride.

To form the first gate insulation pattern 50a including dual thin film patterns 120a and 120b in accordance with an example embodiment of the present invention, after a first film of hafnium silicon oxynitride and a second film of aluminum oxide are sequentially formed on the semiconductor substrate 10, a portion of the second film disposed on the second impurity region is selectively removed.

Next, additional layers may be formed on the semiconductor substrate 10 by a process similar to the process previously described with reference to FIGS. 2B through 2E for forming corresponding layers on the semiconductor substrate 10 (of FIGS. 2B through 2E, etc.) on which the gate insulating layer 12 is formed. All of the layers formed on the semiconductor substrate 10 of FIG. 5 are then selectively etched to form the first and the second gate patterns 52a and 52b on the first and the second impurity regions, respectively. Thus, in the illustrated embodiment, the first gate pattern 52a includes the first gate insulation pattern 50a having the dual thin film patterns, and the second gate pattern 52b includes the second gate insulation pattern 50b formed from hafnium silicon oxynitride. The dual thin film patterns includes the first thin film pattern 120b formed from hafnium silicon oxynitride and the second thin film pattern 120a formed from aluminum oxide.

As described previously, example embodiments of the present invention provide various structures for gate patterns including metal.

Figure 6:
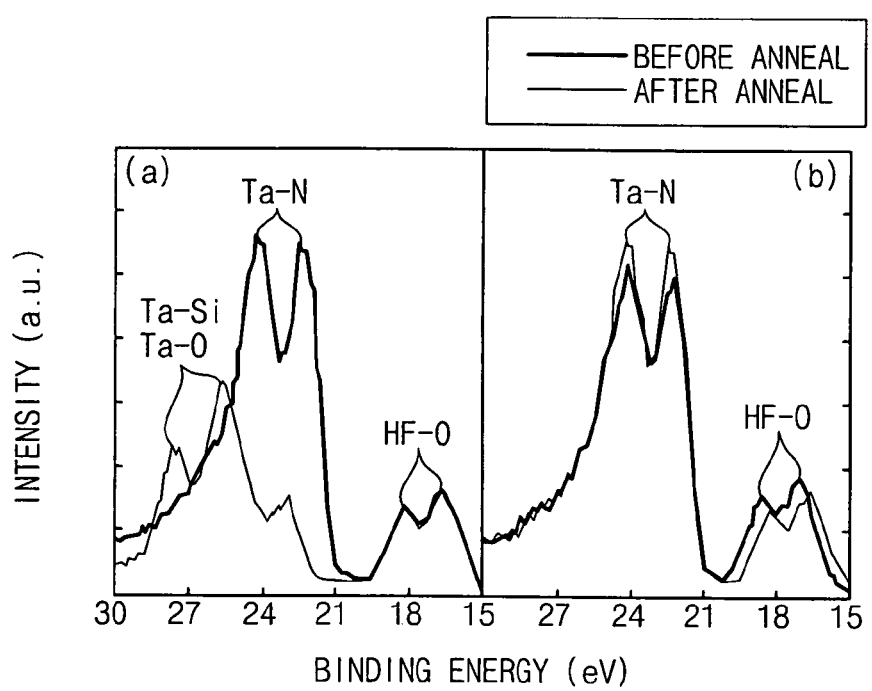

FIG. 6 shows graphs illustrating binding energies of materials that gate patterns of a semiconductor device, in accordance with an example embodiment of the present invention. In FIG. 6, a graph (a) shows binding energies of materials that a gate pattern formed on a second impurity region of a semiconductor substrate, and a graph (b) shows binding energies of materials that a gate pattern formed on a first impurity region of the semiconductor substrate.

Each gate pattern used to obtain the data illustrated in the graphs comprised a gate insulation layer pattern formed from a hafnium silicon oxynitride film and a gate conductive layer including a tantalum nitride film and a polysilicon film. A first portion of the tantalum nitride film formed on the first impurity region had a thickness of about 100 Å, whereas a second portion of the tantalum nitride film formed on the second impurity region had a thickness of about 30 Å. The tantalum nitride film was analyzed using an X-ray photoelectron spectroscopy (XPS) after the tantalum nitride film was thermally treated.

Referring to FIG. 6, graph (a) shows that tantalum and nitrogen exist in the second portion of the tantalum nitride film before the thermal treatment (i.e., "BEFORE ANNEAL"), and shows that tantalum, silicon, and oxygen exist in the second portion of the tantalum nitride film after the thermal treatment (i.e., "AFTER ANNEAL"). Graph (b) shows that tantalum and nitrogen exist in the first portion of the tantalum nitride film before and after the thermal treatment. Therefore, the respective gate patterns may properly be used in the first impurity region and the second impurity region (i.e., one gate pattern may properly be used in the first impurity region and the other gate pattern may properly be used in the second impurity region) because the gate patterns have substantially different compositions.

In accordance with example embodiments of the present invention, gate patterns including metal and formed through simple manufacturing processes may be advantageously used in an NMOS region and a PMOS region because the respective gate patterns for the NMOS and PMOS regions have substantially different characteristics that are suitable for the NMOS and PMOS regions, respectively. Thus, the gate patterns including metal may have improved electrical characteristics relative to conventional gate patterns that do not include metal, and work functions of the gate patterns may be easily adjusted. Additionally, when a semiconductor device includes the gate patterns that contain metal, the semiconductor device may have enhanced electrical characteristics.

Although example embodiments of the present invention have been described herein, the present invention is not limited to those example embodiments. Rather, modifications may be made to the example embodiments without departing from the scope of the present invention as defined by the following claims.

What is claimed is:

1. A method of manufacturing a semiconductor device comprising:
    forming a gate insulation layer on a semiconductor substrate having a first impurity region and a second impurity region;
    forming a metal layer having a first thickness on the gate insulation layer;
    forming a preliminary pattern having a second thickness substantially smaller than the first thickness by partially removing a portion of the metal layer over the second impurity region;
    forming a polysilicon layer on a resultant structure comprising the preliminary pattern;
    transforming the preliminary pattern into a metal silicide layer through a reaction between the preliminary pattern and the polysilicon layer; and, etching the polysilicon layer, the metal silicide layer, the metal layer, and the gate insulation layer to form a first gate pattern on the first impurity region and a second gate pattern on the second impurity region,
    wherein the first gate pattern comprises a first gate insulation layer pattern, a metal layer pattern having the first thickness, and a first polysilicon layer pattern and,
    wherein the second gate pattern comprises a second gate insulation layer pattern, a metal silicide layer pattern having a thickness less than the first thickness, and a second polysilicon layer pattern.

2. The method of 1, wherein the first impurity region is a PMOS region and the second impurity region is an NMOS region.

3. The method of claim 1, wherein the gate insulation layer comprises at least one material selected from the group of materials consisting of hafnium oxide, hafnium oxynitride, hafnium silicon oxynitride, zirconium oxide, zirconium oxynitride, zirconium silicon oxynitride, tantalum oxide, tantalum oxynitride, tantalum silicon oxynitride, aluminum oxide, aluminum oxynitride, aluminum silicon oxynitride, titanium oxide, titanium oxynitride, and titanium silicon oxynitride.

4. The method of claim 1, wherein the metal layer comprises at least one material selected from the group of materials consisting of nickel, tungsten, platinum, titanium, tantalum, zirconium, copper, ruthenium, hafnium, aluminum, titanium nitride, titanium aluminum nitride, hafnium nitride, hafnium aluminum nitride, tantalum nitride, tantalum aluminum nitride, zirconium aluminum nitride, and aluminum nitride.

5. The method of claim 1, wherein forming the preliminary pattern comprises:
    forming an etching mask on a first portion of the metal layer disposed over the first impurity region; and,
    partially removing an exposed second portion of the metal layer positioned over the second impurity region using an etching solution, wherein the etching solution comprises a standard cleaning 1 (SC-1) solution comprising ammonia, hydrogen peroxide and water, and ethylene diamine tetraacetic acid (EDTA).

6. The method of claim 5, wherein the etching mask comprises a photoresist or an oxide.

7. The method of claim 5, further comprising treating the exposed second portion of the metal layer with a nitrogen plasma treatment.

8. The method of claim 7, wherein the nitrogen plasma treatment is performed at a pressure of about 5 to 50 mTorr, with a power of about 1,000 to 2,000 Watts for about 60 to 120 seconds.

9. The method of claim 7, wherein the etching solution has a temperature of about 20 to 80° C. when the nitrogen plasma treatment is performed.

10. The method of claim 1, wherein a ratio between the first thickness and the second thickness ranges from about 10:1 to about 2:1.

11. The method of claim 1, wherein the reaction between the preliminary pattern and the polysilicon layer is performed at a temperature between about 120 to 1,200° C. and at the same temperature at which the polysilicon layer is formed.

12. The method of claim 1, wherein the reaction between the preliminary pattern and the polysilicon layer is performed using a thermal treatment at a temperature between about 700 to 1,200° C.

13. The method of claim 12, wherein the thermal treatment is performed for about 10 to 300 seconds.

14. The method of claim 1, further comprising thermally treating the metal layer at a temperature of about 450 to 650° C. for about 10 to 60 seconds.

15. A method of manufacturing a semiconductor device comprising:
    forming a gate insulation layer on a semiconductor substrate having a first impurity region and a second impurity region;
    forming a lower metal layer having a first thickness on the gate insulation layer, wherein a first portion of the lower metal layer is disposed over the first impurity region and a second portion of the lower metal layer is disposed over the second impurity region;
    forming a lower polysilicon layer directly on the second portion of the lower metal layer;
    transforming the second portion of the lower metal layer into a metal silicide layer disposed directly on the gate insulation layer through a reaction between the lower metal layer and the lower polysilicon layer;
    forming an upper metal layer having a second thickness, wherein the upper metal layer is formed continuously on the lower polysilicon layer and the first portion of the lower metal layer;
    forming an upper polysilicon layer on the upper metal layer; and, patterning the upper polysilicon layer, the upper metal layer, the lower polysilicon layer, the metal silicide layer, the first portion of the lower metal layer, and the gate insulation layer to form a first gate pattern on the first impurity region and a second gate pattern on the second impurity region,
    wherein the first gate pattern comprises a first gate insulation layer pattern, a lower metal layer pattern, a first upper metal layer pattern, and a first polysilicon layer pattern, and,
    wherein the second gate pattern comprises a second gate insulation layer pattern, a metal silicide pattern, a second polysilicon layer pattern, a second upper metal layer pattern, and a third polysilicon layer pattern.

16. The method of claim 15, wherein the first impurity region is a PMOS region and the second impurity region is an NMOS region.

17. The method of claim 15, wherein the gate insulation layer comprises at least one material selected from the group of materials consisting of hafnium oxide, hafnium oxynitride, hafnium silicon oxynitride, zirconium oxide, zirconium oxynitride, zirconium silicon oxynitride, tantalum oxide, tantalum oxynitride, tantalum silicon oxynitride, aluminum oxide, aluminum oxynitride, aluminum silicon oxynitride, titanium oxide, titanium oxynitride, and titanium silicon oxynitride.

18. The method of claim 15, wherein the lower metal layer and the upper metal layer each respectively comprise at least one material selected from the group of materials consisting of nickel, tungsten, platinum, titanium, tantalum, zirconium, copper, ruthenium, hafnium, aluminum, titanium nitride, titanium aluminum nitride, hafnium nitride, hafnium aluminum nitride, tantalum nitride, tantalum aluminum nitride, zirconium aluminum nitride, and aluminum nitride.

19. The method of claim 15, wherein a ratio between the first thickness and the second thickness ranges from about 10:1 to about 2:1.

20. The method of claim 15, wherein the reaction between the lower metal layer and the lower polysilicon layer is performed at a temperature between about 120 to 1,200° C. and at the same temperature at which the polysilicon layer is formed.

21. The method of claim 15, wherein the reaction between the lower metal layer and the lower polysilicon layer is performed using a thermal treatment at a temperature between about 700 to 1,200° C.

22. The method of claim 21, wherein the thermal treatment is performed for about 10 to 300 seconds.

* * * * *